(12) United States Patent
Hiraki

(10) Patent No.: US 8,756,800 B2
(45) Date of Patent: Jun. 24, 2014

(54) ELECTRONIC COMPONENT MOUNTING METHOD

(75) Inventor: Tsutomu Hiraki, Yamanashi (JP)

(73) Assignee: Panasonic Corporation, Osaka (JP)

( * ) Notice: Subject to any disclaimer, the term of this patent is extended or adjusted under 35 U.S.C. 154(b) by 459 days.

(21) Appl. No.: 12/755,695

(22) Filed: Apr. 7, 2010

(65) Prior Publication Data

US 2010/0257728 A1 Oct. 14, 2010

(30) Foreign Application Priority Data

Apr. 8, 2009 (JP) .............................. P2009-093806

(51) Int. Cl.
*H05K 3/30* (2006.01)

(52) U.S. Cl.
USPC .................. 29/832; 29/740; 29/741; 220/506; 228/180.1; 156/571

(58) Field of Classification Search
USPC ............ 29/739, 740, 741, 837, 832; 220/506; 228/180.1, 180.21, 180.22; 156/571
See application file for complete search history.

(56) References Cited

U.S. PATENT DOCUMENTS

2008/0104831 A1  5/2008  Haji et al.

FOREIGN PATENT DOCUMENTS

| CN | 1843069 A | 10/2006 |
| JP | 2001-7136 A | 1/2001 |
| JP | 2003-298292 | * 10/2003 |

OTHER PUBLICATIONS

Office action for Chinese Patent Application No. 201010164017.2 dated Jul. 30, 2013.

* cited by examiner

*Primary Examiner* — Peter DungBa Vo
*Assistant Examiner* — Jeffrey T Carley
(74) *Attorney, Agent, or Firm* — Pearne & Gordon LLP

(57) ABSTRACT

An electronic component mounting method is disclosed. The method includes the following steps: applying a paste remaining on a stamping pin to the bottom wall of at least one reservoir; forming the paste retained in the at least one reservoir to a predetermined film thickness by a clearance regulation section; causing the paste formed into a film to adhere to the stamping pin; stamping the paste to a substrate; and mounting the electronic components held by a mounting head to the substrate on which the paste has been stamped.

2 Claims, 5 Drawing Sheets

ELECTRONIC COMPONENT MOUNTING METHOD

BACKGROUND

1. Field of the Invention

The present invention relates to an electronic component mounting apparatus that mounts electronic components on a substrate with a paste adhesive stamped thereto.

2. Description of the Related Art

In a field of electronic components being mounted on a substrate, stamping a paste adhesive affixed to a stamping pin provided on a stamping head to the substrate has hitherto been known as a method for supplying the substrate with the paste adhesive. The stamping pin has a stamp surface for letting the paste adhesive adhere and stamping the thus-adhering adhesive to a substrate. Projections appropriate for a shape desired to be stamped are formed on the stamp surface. Although the paste adhesive adhering to the projection is stamped to the substrate, the paste adhesive builds up in space between the projections with an increase in the number of times stamp is performed. The adhesive adheres to a substrate, which in turn becomes a cause for deteriorating stamp quality. A hitherto known apparatus has a cleaning unit disposed between a paste adhesive supply position and a stamp position. A stamp surface is brought into contact with a cleaning material, such as non-woven fabric, thereby cleaning the stamp surface and removing the built-up paste adhesive (see Patent Document 1).

Patent Document 1: JP-A-2001-7136

However, the cleaning unit is situated at a position where the cleaning unit occupies a location and does not interfere with another member. Therefore, the cleaning unit does not always situate at a position on a traffic line of the stamp head achieved during normal operation. For this reason, the stamp head is required to perform movement, which differs from movement performed during normal operation, for cleaning purpose. As a result, there arises a problem of movement of the stamp head involving consumption of time and deterioration of productivity.

SUMMARY OF THE INVENTION

The present invention aims at providing an electronic component mounting apparatus that can eliminate a paste adhesive from a stamp pin without deterioration of productivity.

A first aspect of the invention provides with an electronic component mounting apparatus, comprising: a paste retaining section retaining a paste that bonds an electronic component to a substrate; a stamp head causing the paste of the paste retaining section to attach to a stamp pin and stamping the paste to the substrate; and a mounting head mounting the electronic component to the substrate to which the paste has been stamped; wherein the paste retaining section has at least two annular reservoirs that are concentrically arranged, a reservoir rotation section rotating the reservoirs, a squeegee shielding cross sections of at least one of the reservoirs, and a clearance regulation section adjusting clearance between the squeegee and a bottom wall of the at least one of reservoirs; and wherein the paste remained on the stamp pin is test-stamped to at least the other one of the reservoirs.

According to the present invention, a paste reservoir is embodied as a plurality of concentrically-arranged annular reservoirs, and one of the reservoirs is used as a test-stamping field. A necessity for providing a test-stamping field is obviated, and a distance over which the stamping head moves for test-stamping purpose can be shortened.

DESCRIPTION OF THE PREFERRED EMBODIMENTS

Figure 1:
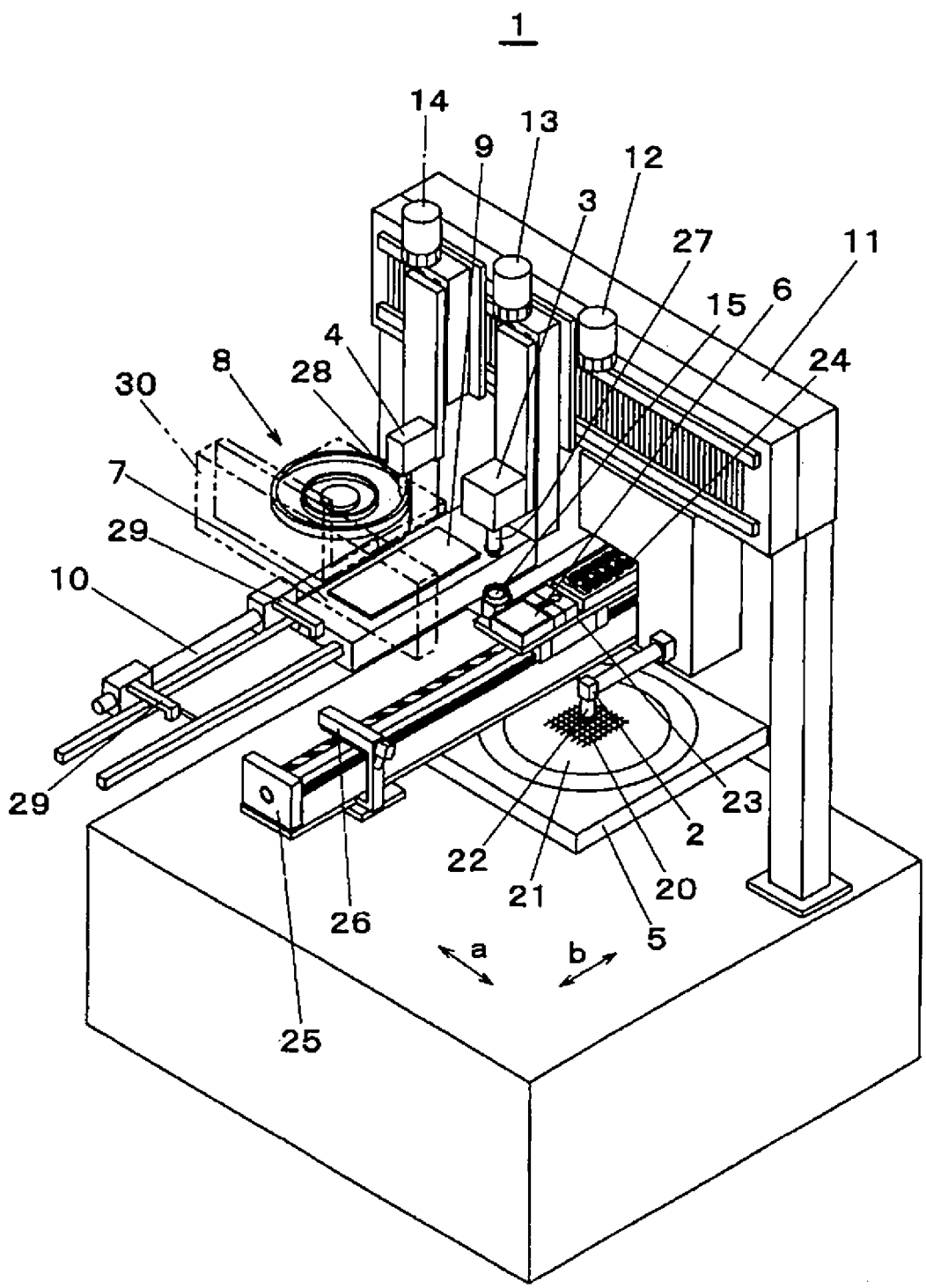
FIG. 1 is an oblique perspective view of an electronic component mounting apparatus of an embodiment of the present invention.
Figure 2:
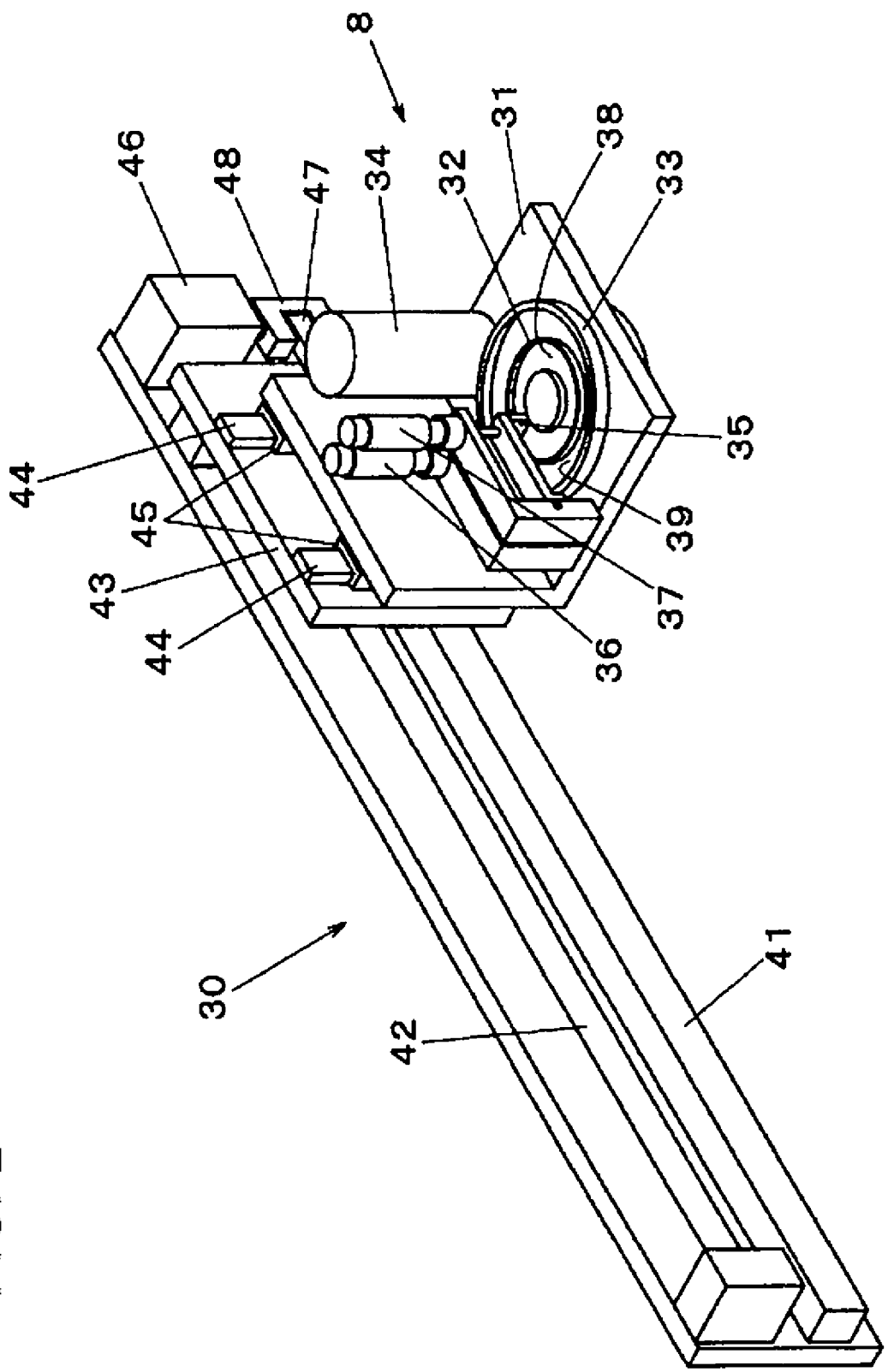
FIG. 2 is an oblique perspective view of a paste supply section movement mechanism of the embodiment of the present invention.
Figure 3:
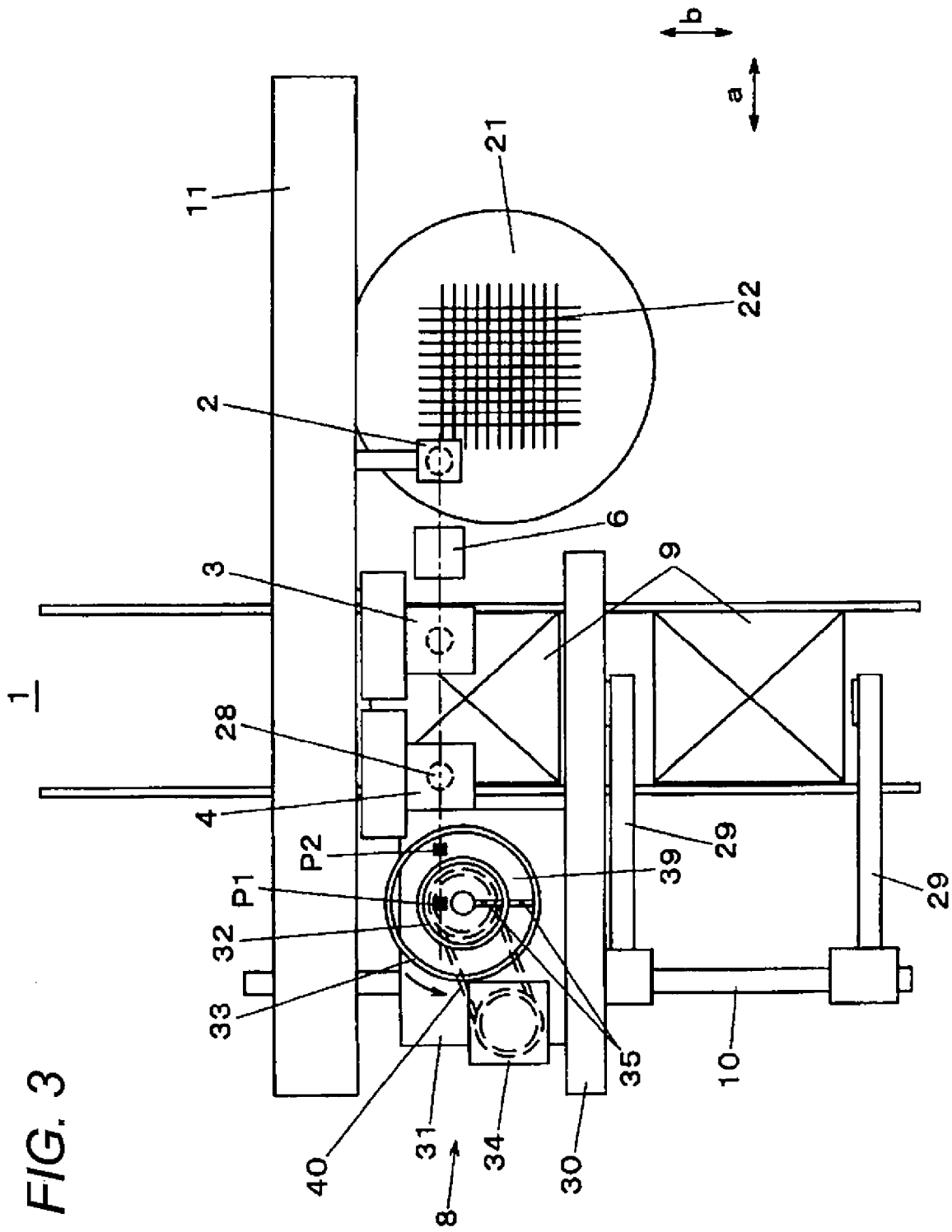
FIG. 3 is a plan view of the electronic component mounting apparatus of the embodiment of the present invention.
Figure 4:
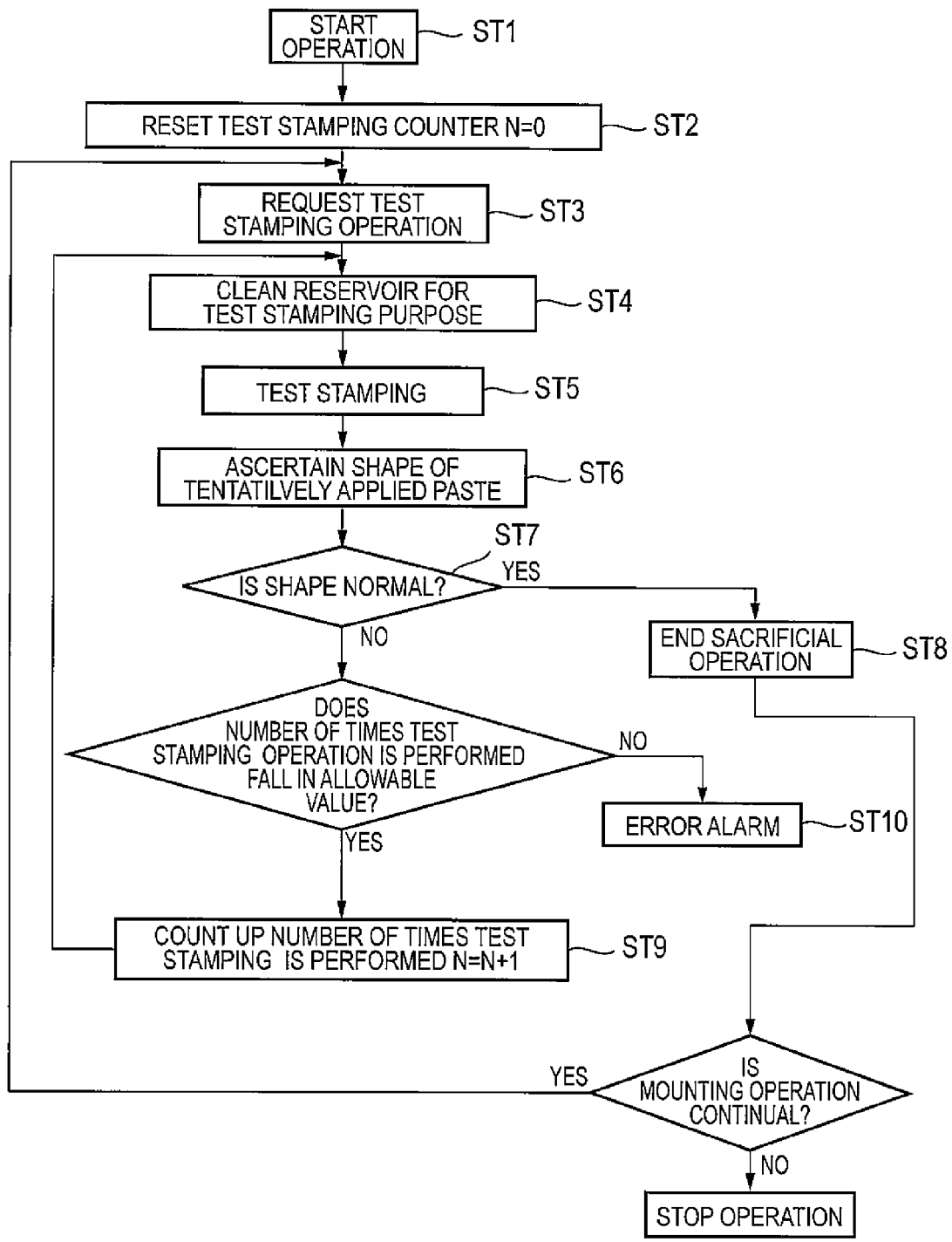
FIG. 4 is a flowchart of test-stamping operation of the electronic component mounting apparatus of the embodiment of the present invention.
Figure 5:
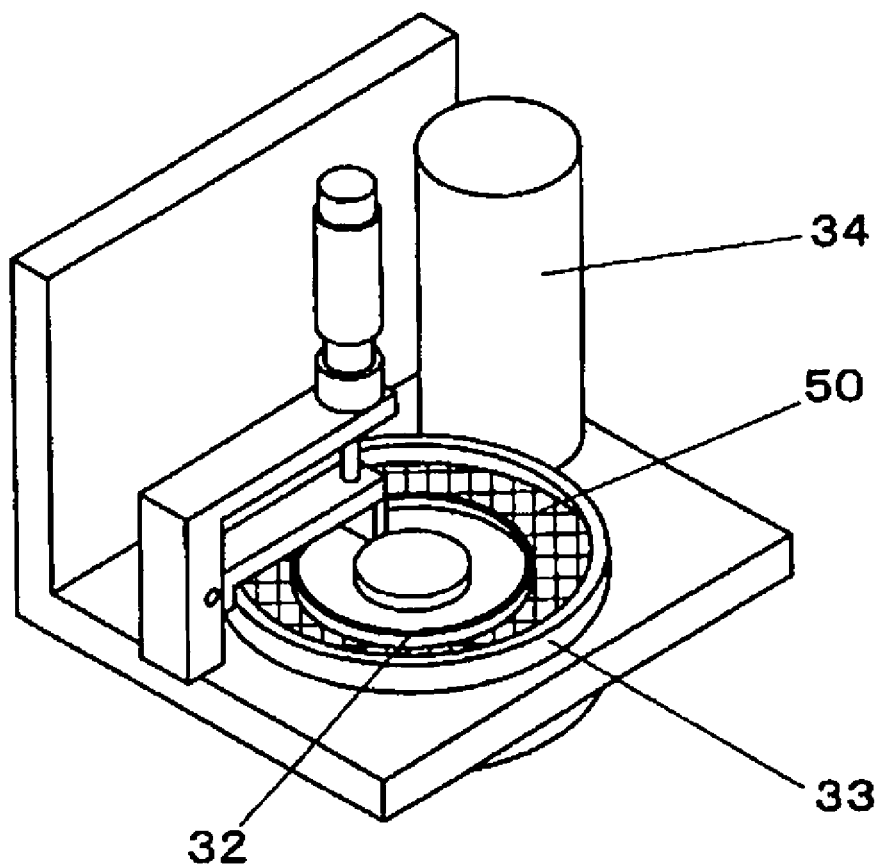
FIG. 5 is an oblique perspective view of a reservoir of the embodiment of the present invention.

An embodiment of the present invention is now described by reference to the drawings. FIG. 1 is an oblique perspective view of an electronic component mounting apparatus of an embodiment of the present invention; FIG. 2 is an oblique perspective view of a paste supply section movement mechanism of the embodiment of the present invention; FIG. 3 is a plan view of the electronic component mounting apparatus of the embodiment of the present invention; FIG. 4 is a flowchart of test-stamping operation of the electronic component mounting apparatus of the embodiment of the present invention; and FIG. 5 is an oblique perspective view of a reservoir of the embodiment of the present invention.

As shown in FIG. 1, an electronic component mounting apparatus 1 includes, as principal portions, three working heads; namely, a pickup head 2, a bonding head 3, and a stamping head 4, and four working tables; namely, a component supply table 5, a component relay table 6, a mounting table 7, and a paste supply table 8. The working heads are arranged, in a depth-wise direction, in sequence of the pickup head 2, the bonding head 3, and the stamping head 4 from a front side to a rear side of the electronic component mounting apparatus 1. Likewise, the working tables are arranged in sequence of the component supply table 5, the component relay table 6, the mounting table 7, and the paste supply table 8. In addition, the electronic component mounting apparatus 1 has a substrate conveyance mechanism 10 for conveying a substrate 9, a rectilinearly movable mechanism 11 for moving the respective working heads, a rectilinearly movable mechanism 30 for moving the paste supply table 8 (see FIG. 2), and four cameras 12, 13, 14, and 15.

The pickup head 2 moves in both a vertical direction and a depth-wise direction of the electronic component mounting apparatus 1 [designated by an arrow "a": a direction orthogonal to a direction of conveyance of the substrate 9 (designated by an arrow "b")], thereby convey chips 20. The chips 20 are affixed onto a wafer sheet 21 held on the component supply table 5. The pickup head 2 attracts each of the chips 20 with a nozzle 22 by suction, to thus peel the chip 20 away from the wafer sheet 21 and place the chip 20 on the component relay table 6.

The first camera 12 ascertains positions and orientations of the chips 20 on the wafer sheet 21. When a positional displacement is ascertained, a correction is made to the position of the chip 20 by moving the component supply table 5 within a horizontal plane and also to an angle of the nozzle 22 according to the orientation of the chip 20.

The component relay table 6 is arranged on a movable table 23 along with a nozzle stocker 24 and the second camera 15. The movable table 23 can move in the direction of conveyance of a substrate (designated by the arrow "b") by means of a rectilinearly movable device 25. A cleaning head 26 is disposed in a travel pathway of the movable table 23. When the movable table 23 moves immediately below the cleaning head 26, the cleaning head 26 cleans up an upper surface of the component relay table 6 (a chip mounting surface) or eliminates an unwanted chip. Nozzles and stamping pins for replacement purpose are stored in the nozzle stocker 24.

The bonding head 3 moves in both the vertical direction and the depth-wise direction (designated by the arrow "a") of the electronic component mounting apparatus 1 and mounts the chip 20 attracted through suction by a nozzle 27 onto the substrate 9. In addition to attracting the chip 20 placed on the component relay table 6 by suction, the bonding head 3 can also directly attract, by suction, the chip 20 from the wafer sheet 21 and the chip 20 attracted through suction by the pickup head 2. When the chip is received from the pickup head 2, the chip 20 turned upside down is attracted by suction along with inversion of the pickup head 2. The chip remaining turned upside down is mounted, as it is, whereby flip-chip bonding is performed.

The third camera 13 ascertains the position and orientation of the chip 20 on the component relay table 6. When positional displacement of the chip is ascertained, a correction is made to a positional relationship between the nozzle 27 and the chip 20 by means of movement of the bonding head 3 (designated by the arrow "a") and movement of the component relay table (designated by the arrow "b"). An angle of the nozzle 27 is corrected according to the orientation of the chip 20. In the case of flip-chip bonding, the second camera 15 captures an image of the chip 20 attracted through suction by the nozzle 27 of the bonding head 3, thereby ascertaining the position and orientation of the chip.

The stamping head 4 moves in both the vertical direction and the depth-wise direction (designated by the arrow "a") of the electronic component mounting apparatus 1 and stamps the paste attached to a stamping pin 28 onto the substrate 9. Paste is retained in the paste supply table 8. The stamping head 4 immerses the stamping pin 28 into the paste, whereby a given amount of paste is affixed to the stamping pin 28. The paste is stamped by pressing the stamping pin 28 against the substrate 9.

A position and a shape of the paste stamped to the substrate 9 may also be ascertained by means of the fourth camera 14. After the paste is ascertained to have been stamped to a correct position and into a correct shape, the chip 20 is mounted onto the paste. The fourth camera 14 is also used for ascertaining the position and orientation of the mounted chip 20.

The substrate 9 conveyed into the electronic component mounting apparatus 1 from its side is conveyed onto the mount table 7 by the substrate conveyance mechanism 10. The substrate conveyance mechanism 10 hooks a tip end of an arm 29 to a rear portion of the substrate 9 and conveys the substrate 9 in such a manner that the substrate 9 is synchronized with movement of the arm 29.

The paste supply table 8 and the rectilinearly movable mechanism 30 are described by reference to FIG. 2. The paste supply table 8 has an L-shaped plate 31 as a principal element, and two annular paste reservoirs 32 and 33 are integrally formed with each other and concentrically arranged on a horizontal portion of the plate. The first reservoir 32 is placed inside the second reservoir 33, and a paste-like adhesive is retained in the first reservoir 32. The second reservoir 33 acts as a vacant reservoir where no paste is present and is used as a test-stamping field for eliminating the paste still remaining on the stamping pin 28. The first reservoir 32 and the second reservoir 33 are rotated around the center axis of the concentric circles by a motor 34.

Each of the reservoirs 32 and 33 has a squeegee 35 for shielding a cross section of the reservoir. The two squeegees 35 can independently ascend or descend by means of regulation mechanisms 36 and 37 using micrometer heads, and the like, to thus be able to adjust clearance between the squeegees 35 and bottom walls 38, 39 of the respective reservoirs 32, 33 according to elevated and lowered positions. The paste retained in the first reservoir 32 is made, at a position downstream of the squeegee 35, to a uniform thickness commensurate with clearance between the squeegee 35 and the bottom wall 38. Meanwhile, in the second reservoir 33, the applied paste is scraped by the squeegee 35 held in close contact with the bottom wall 39, so that no paste adheres to a downstream portion of the bottom wall 39 with respect to the squeegee 35. Since there is no chance of paste again adhering to the stamping pin 28 at the downstream position with respect to the squeegee 35, the paste can be applied again and again even in a small area diverted from the paste reservoir. Further, the application can always be performed at the same location.

As shown in FIG. 3, the electronic component mounting apparatus 1 is arranged such that the concentrically-arranged two annular reservoirs 32 and 33 are spaced apart from the substrate 9 in the direction of movement of the stamping head 4, so that the stamping head 4 can linearly move between the reservoirs 32 and 33 and the substrate 9. Paste is stored in the inner first reservoir 32, and the outer second reservoir 33 serves as a paste application field. The stamping head 4 performs paste stamping operation while moving between a position P1 set on the first reservoir 32 and the substrate 9. A position P2 where the application is performed is set on the second reservoir 33 along the traffic line of the stamping head 4.

The stamping head 4 immerses the stamping pin 28 into the paste of the first reservoir 32 at the paste receive position P1, thereby causing the paste of a regulated thickness to adhere to the stamping pin 28. The stamping head moves to a position above the substrate 9 and stamps the paste to the substrate 9 after being positioned. The test paste application position P2 is situated in a direction "a" (the direction of movement of the stamping head 4) with respect to the paste receive position P1 and along the traffic line of the stamping head 4 that moves between the first reservoir 32 and the substrate 9 for stamping operation. Therefore, the stamping head 4 can perform application operation without moving away from the traffic line during stamping operation.

A rotary shaft of the motor 34 and the paste reservoirs 32 and 33 are coupled together at a rear of the L-shaped plate 31 by an endless belt 40. The pickup head 2, the component relay table 6, and the bonding head 3 are arranged along the traffic line of the stamping head 4. Specifically, the pickup head 2, the bonding head 3, and the stamping head 4 are arranged so as to move along a single traffic line. By means of such an arrangement, exchange of a chip between the heads and positioning for taking over operation can readily be performed.

The rectilinearly movable mechanism 30 is made up of a horizontally-extending rail 41, a rod-less cylinder 42, and a slider 43 slidably attached to the rail 41, A built-in magnet provided in the rod-less cylinder 42 is pneumatically actuated, whereby a slider 43 exhibiting a magnetic property moves so as to follow motion of the magnet. The slider 43 is provided with a rail 44 extending in the vertical direction, and another slider 45 attached to a vertical portion of the L-shaped plate 31 is slidably attached to the rail 44.

The paste supply table 8 can move in the depth-wise direction (designated by the arrow "a") of the electronic component mounting apparatus 1 while taking the entire length of the rail 41 as a travel. When paste is stamped to the substrate 9, the paste supply table 8 is moved to the rear side of the electronic component mounting apparatus 1, to thus approach the substrate 9. A travel distance of the stamping head 4 is thus shortened, thereby attempting to enhance efficiency of stamping operation. On the contrary, the paste supply table 8 is reversely moved toward the front side during maintenance operation, such as cleaning of the reservoirs 32 and 33 and replenishment of the paste, so as to approach an operator situated at the front. Thus, operability of maintenance is enhanced.

Even when ascertaining a shape of paste applied to the second reservoir 33 by use of the third camera 13, the paste supply table 8 performs movement. The fourth camera is for ascertaining the shape of the paste stamped to the substrate 9, or the like. Since the position where paste is to be stamped and the position P2 where paste is to be applied are arranged side by side along the direction of movement of the paste supply table 8, the paste supply table 8 is moved, whereby the paste applied to an angular field of view of the fixed fourth camera 14 can be moved.

The rectilinearly movable mechanism 30 has a paste supply table elevation mechanism 46 for vertically moving the paste supply table 8. The paste supply table elevation mechanism 46 is a cylinder mechanism having a recess 48 that is provided at a leading end of a piston rod so as to engage with a protrusion 47 formed on a side of the L-shaped plate 31. The paste supply table elevation mechanism 46 causes the paste supply table 8 to ascend or descend by means of extraction and contraction of the piston rod. The paste supply table elevation mechanism 46 is disposed on the rear side of the electronic component mounting apparatus 1 and controls an elevated or lowered position of the paste supply table 8 in such a way that a difference of elevation between a liquid level of paste and an upper surface of the substrate 9 becomes smaller. In this case, the paste supply table 8 descends closer to the substrate 9, which may interfere with the arm 29 in motion. For this reason, the paste supply table 8 is caused to ascend during a period of conveyance of a substrate to an elevated position where the table does not interfere with the arm 29 in motion.

Application operation of the electronic component mounting apparatus 1 is now described by reference to a flowchart shown in FIG. 4. When the electronic component mounting apparatus 1 starts operation (ST1), a test-stamping counter is first reset to zero (ST2). The applied counter is provided in a control system of the electronic component mounting apparatus 1 and counts the number of times test-stamping is performed. Since a count achieved as a result of count-up operation having been performed during previous operation is sometimes left in the test-stamping counter, the counter must be reset to zero on the occasion of initiation of new operation.

The electronic component mounting apparatus 1 started operation requires performance of test-stamping at predetermined timing (ST3). Paste is pressed against the stamping pin 28 at the time of stamping operation and becomes affixed with elapse of time. Timing at which the request is issued is generally determined from a time elapsed since operation was started and the number of times paste stamping operation is performed. Therefore, a round of test-stamping operations are performed at the time of replacement of a substrate and a chip or replacement of each of the nozzles, so as not to interrupt production for test-stamping operation.

The round of test-stamping operation starts from cleaning (ST4) of the second reservoir 33 that is a reservoir for test-stamping. Cleaning of the second reservoir 33 is performed by rotating the second reservoir 33 while the squeegees 35 remain in close contact with the bottom wall 39. In relation to the first test-stamping operation performed after initiation of operation, since no paste is yet affixed to the bottom wall 39, the cleaning operation may also be omitted. Subsequently, test-stamping operation for pressing the stamping pin 28 against the bottom wall 39 is performed (ST5). By means of the test-stamping operation, at least a portion of the paste still remaining in contact with the bottom wall 39 of the paste still remaining on the stamping pin 28 adheres to the bottom wall 39, to thus be eliminated from the stamping pin 28.

Next, the third camera 13 photographs the shape of the paste applied on the bottom wall 39, to thus ascertain the shape of the paste (ST6). Since the shape of the paste changes according to an amount and a position of the paste still remaining on the stamping pin 28 as well as to a type of the stamping pin 28, shape patterns of paste are previously created as electronic data, and image data pertaining to the paste applied on the bottom wall 39 are matched against the electronic data. When the shape of the paste is ascertained to be normal as a result of the match with the shape patterns (ST7), the test-stamping operation ends (ST8). The number of times test-stamping operation is performed is counted up (ST9), and the electronic component mounting apparatus returns to normal mounting operation.

A normal shape of paste is a shape that makes it possible to eliminate majority of the paste still remaining on the stamping pin 28 by means of test-stamping operation, so that a resultant shape is considered to be or can be seen to be identical with a shape of the paste adhered to the bottom wall 39. When the paste adhering to the bottom wall 39 assumes such a shape, the stamping pin 28 can be considered to be in a cleaned state where no paste remains on the stamping pin.

When the shape of the paste is ascertained to be anomaly as a result of matching (ST7), the number of times test-stamping operation is performed is counted up (ST9), and the round of test-stamping operations (ST4 to ST6) are again iterated. The round of test-stamping operation (ST4 to ST6) are iterated until the shape of paste is ascertained to be normal. When the number of test-stamping operations exceeds a preset allowable value, it is determined that the stamping pin 28 cannot be cleaned by test-stamping operation, and an error alarm is issued (ST10).

Upon receipt of the error alarm, the operator temporarily suspends operation of the electronic component mounting apparatus 1 and visually checks the state of the stamping pin 28. If the stamping pin can be cleaned by means of washing, or the like, the cleaned stamping pin 28 is used as it is, and operation of the electronic component mounting apparatus 1 is resumed. When it is determined that the stamping pin cannot readily be cleaned, the stamping pin is replaced with another stamping pin, and operation of the electronic component mounting apparatus 1 is subsequently resumed.

The stamping pin may also be automatically replaced in place of the error alarm (ST10). In this case, the stamping head 4 is moved up to a nozzle stocker 24, where the head is replaced with a stamping pin stored in the nozzle stocker 24. Subsequently, stamping operation is continually performed by use of the thus-replaced new stamping pin.

Since the reservoirs 32 and 33 are formed from metal or resin in many cases, the bottom wall 39 itself has no capability of cleaning the stamping pin 28. Accordingly, as shown in FIG. 5, a cleaning material 50, such as felt impregnated with a chemical that dissolves paste, is placed on the bottom wall of the second reservoir 33, whereby the stamping pin 28 can be cleaned. In this case, the cleaning material 50 keeps a portion of the bottom wall exposed rather than covering the entirety of the bottom wall, whereby the stamping pin 28 can be cleaned by combined use of test-stamping operation and cleaning operation. For instance, when the shape of paste is not normal even as a result of test-stamping operation being iterated several times, the stamping pin 28 can also be cleaned.

In the foregoing embodiment, paste is stored in the first reservoir 32 and test-stamped in the second reservoir 33. However, the first reservoir 32 may also be used for test-stamping purpose, and paste may also be retained in the second reservoir 33. In this case, the position P2 shown in FIG. 2 serves as a stamping position, and the position P1 serves as a test-stamping position. Since a direct distance between the stamping position P2 and the substrate 9 thereby becomes shorter, the time required to actuate the stamping head 4 can be shortened, so that productivity is enhanced. On the contrary, the amount of travel required during test-stamping operation is increased. However, the test-stamping operation is performed less frequently as compared with stamp operation. Therefore, productivity is not deteriorated.

A paste reservoir is provided as a plurality of concentrically-arranged annular reservoirs, and one of the reservoirs is used as a test-stamping field. As a result, a necessity for providing a specifically-designed test-stamping field is obviated. There is also yielded an advantage of the ability to shorten a distance over which the stamping head travels for test-stamping purpose.

The present invention is useful in a field where electronic components are mounted by stamping paste to a substrate.

What is claimed is:

1. An electronic component mounting method including causing paste in a paste retaining section that bonds an electronic component to a substrate to adhere to a stamping pin provided on a stamping head and stamping the paste to the substrate, and mounting the electronic component held by a mounting head to the substrate on which the paste has been stamped;
   wherein the paste retaining section has at least two concentrically-arranged annular reservoirs that are integrally formed with each other, a reservoir rotation section for rotating the reservoirs, a squeegee shielding cross sections of at least one of the reservoirs, and a clearance regulation section adjusting clearance between the squeegee and a bottom wall of the at least one of reservoirs;
   wherein the at least two reservoirs include at least one vacant reservoir where no paste is present; wherein the method comprises:
   removing and stamping the paste remaining on the stamping pin to the bottom wall of the at least one vacant reservoir;
   forming the paste retained in the at least one of the reservoirs to a predetermined film thickness by the clearance regulation section;
   causing the paste formed into a film to adhere to the stamping pin;
   stamping the paste to the substrate; and
   mounting the electronic components held by the mounting head to the substrate on which the paste has been stamped.

2. The electronic component mounting method according to claim 1, wherein the film thickness of the paste is determined by ascending or descending the squeegee to adjust the clearance between the squeegee and the bottom wall.

* * * * *